(12) United States Patent
Ju et al.

(10) Patent No.: US 11,610,821 B2
(45) Date of Patent: Mar. 21, 2023

(54) METHOD FOR FORMING A SEMICONDUCTOR DEVICE INVOLVING THE USE OF STRESSOR LAYER

(71) Applicant: United Semiconductor (Xiamen) Co., Ltd., Fujian (CN)

(72) Inventors: Rui Ju, Shamen (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 35 days.

(21) Appl. No.: 17/381,164

(22) Filed: Jul. 20, 2021

(65) Prior Publication Data
US 2022/0406665 A1  Dec. 22, 2022

(30) Foreign Application Priority Data
Jun. 18, 2021  (CN) .................. 202110676015.X

(51) Int. Cl.
*H01L 29/10* (2006.01)
*H01L 29/78* (2006.01)
*H01L 21/8238* (2006.01)
*H01L 21/28* (2006.01)

(52) U.S. Cl.
CPC ........... *H01L 21/823842* (2013.01); *H01L 21/28035* (2013.01); *H01L 29/1054* (2013.01); *H01L 29/7847* (2013.01)

(58) Field of Classification Search
CPC ............ H01L 29/7847; H01L 29/7542; H01L 29/7843; H01L 29/7845; H01L 29/1054; H01L 21/28035; H01L 21/28525; H01L 29/4916; H01L 29/4983
See application file for complete search history.

(56) References Cited

U.S. PATENT DOCUMENTS

| 2006/0226490 A1* | 10/2006 | Burnett | ............... H01L 27/1116 257/365 |
| 2009/0032877 A1* | 2/2009 | Visokay | ............... H01L 29/7847 257/E21.409 |
| 2009/0294866 A1* | 12/2009 | Eller | ................ H01L 29/66545 438/231 |

(Continued)

FOREIGN PATENT DOCUMENTS

| CN | 103579118 A | 2/2014 |
| CN | 103730469 A | 4/2014 |

OTHER PUBLICATIONS

Pandey, S M et al. "Mechanism of Stress Memorization Technique (SMT) and Method to Maximize Its Effect." IEEE electron device letters 32.4 (2011): 467-469. Web. (Year: 2011).*

*Primary Examiner* — Marcos D. Pizarro
*Assistant Examiner* — William Henry Anderson
(74) *Attorney, Agent, or Firm* — Winston Hsu

(57) ABSTRACT

A method of forming semiconductor device is disclosed. A substrate having a logic circuit region and a memory cell region is provided. A first transistor with a first gate is formed in the logic circuit region and a second transistor with a second gate is formed in the memory cell region. A stressor layer is deposited to cover the first transistor in the logic circuit region and the second transistor in the memory cell region. The first transistor and the second transistor are subjected to an annealing process under the influence of the stressor layer to recrystallize the first gate and the second gate.

8 Claims, 3 Drawing Sheets

(56) References Cited

U.S. PATENT DOCUMENTS

2011/0269278 A1* 11/2011 Hoentschel ..... H01L 21/823864
                                                            438/230
2013/0149849 A1*  6/2013 Nandakumar .......... H01L 28/20
                                                            438/532
2015/0031179 A1*  1/2015 Thurmer ............. H01L 29/7847
                                                            438/238

* cited by examiner

METHOD FOR FORMING A SEMICONDUCTOR DEVICE INVOLVING THE USE OF STRESSOR LAYER

BACKGROUND OF THE INVENTION

1. Field of the Invention

The present invention relates to the field of semiconductor technology, and particularly relates to an improved method for manufacturing a semiconductor memory device.

2. Description of the Prior Art

Stress engineering has been used to improve device performance of FET devices. Usually, tensile strain is employed for n-type FETs and compressive stress is employed for p-type FETs to improve device performance.

Static random access memories (SRAM) are commonly used in integrated circuits. Embedded SRAM is particularly popular in high speed communication, image processing and system on chip (SOC) applications. SRAM cells have the advantageous feature of holding data without requiring a refresh.

However, the P-type lightly doped drain (PLDD) mask that is omitted in the process of manufacturing ultra-low voltage (ULP) SRAMs below 40 nanometers often causes SRAMs to face the problem of higher standby leakage current (Isb).

SUMMARY OF THE INVENTION

It is one objet of the present invention to provide an improved method for forming semiconductor devices to solve the deficiencies or shortcomings of the prior art One aspect of the invention provides a method for forming a semiconductor device. A substrate having a logic circuit region and a memory cell region thereon is provided. A first transistor having a first gate is formed in the logic circuit region and a second transistor having a second gate is formed in the memory cell region. The first transistor is an NMOS transistor and the second transistor is a PMOS transistor. A stressor layer is deposited to cover the first transistor in the logic circuit region and the second transistor in the memory cell region. The first transistor and the second transistor are subjected to an annealing process to recrystallize the first gate and the second gate under the influence of the stressor layer.

According to some embodiments, the stressor layer is a silicon nitride layer.

According to some embodiments, the stressor layer has a tensile stress.

According to some embodiments, the stressor layer generates a compressive stress that is memorized within the first gate and the second gate when the first gate and the second gate are recrystallized during the annealing process.

According to some embodiments, the compressive stress memorized within the first gate and the second gate induces a compressive strain within a first channel region of the first transistor and a second channel region of the second transistor.

According to some embodiments, the compressive strain enhances performance of the first transistor, while degrades performance of the second transistor.

According to some embodiments, the first gate and the second gate are polysilicon gates.

According to some embodiments, after subjecting the first transistor and the second transistor to the annealing process, the stressor layer is removed.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
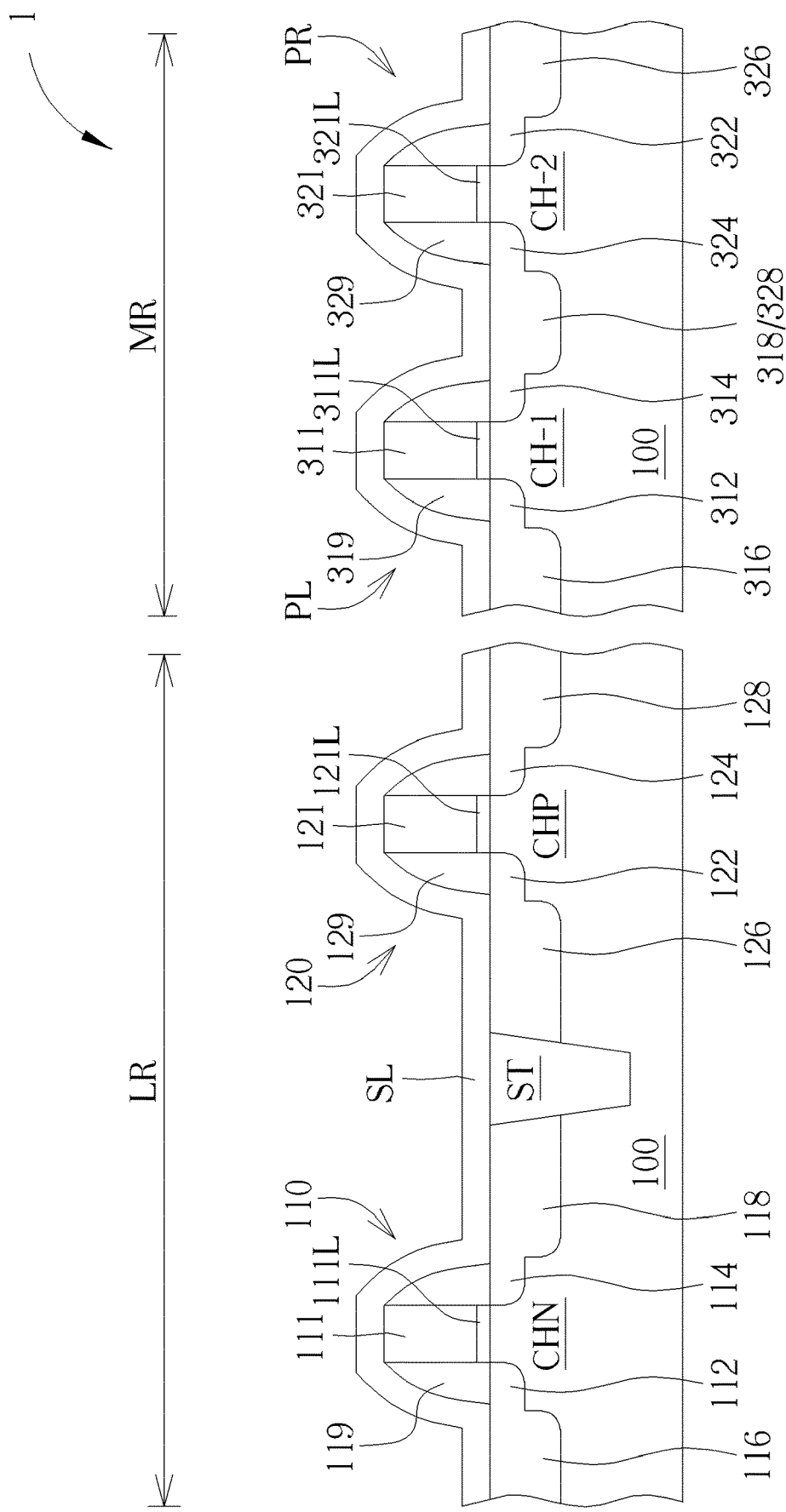
FIG. 1 to FIG. 3 illustrate a method of forming a semiconductor device.
Figure 2:
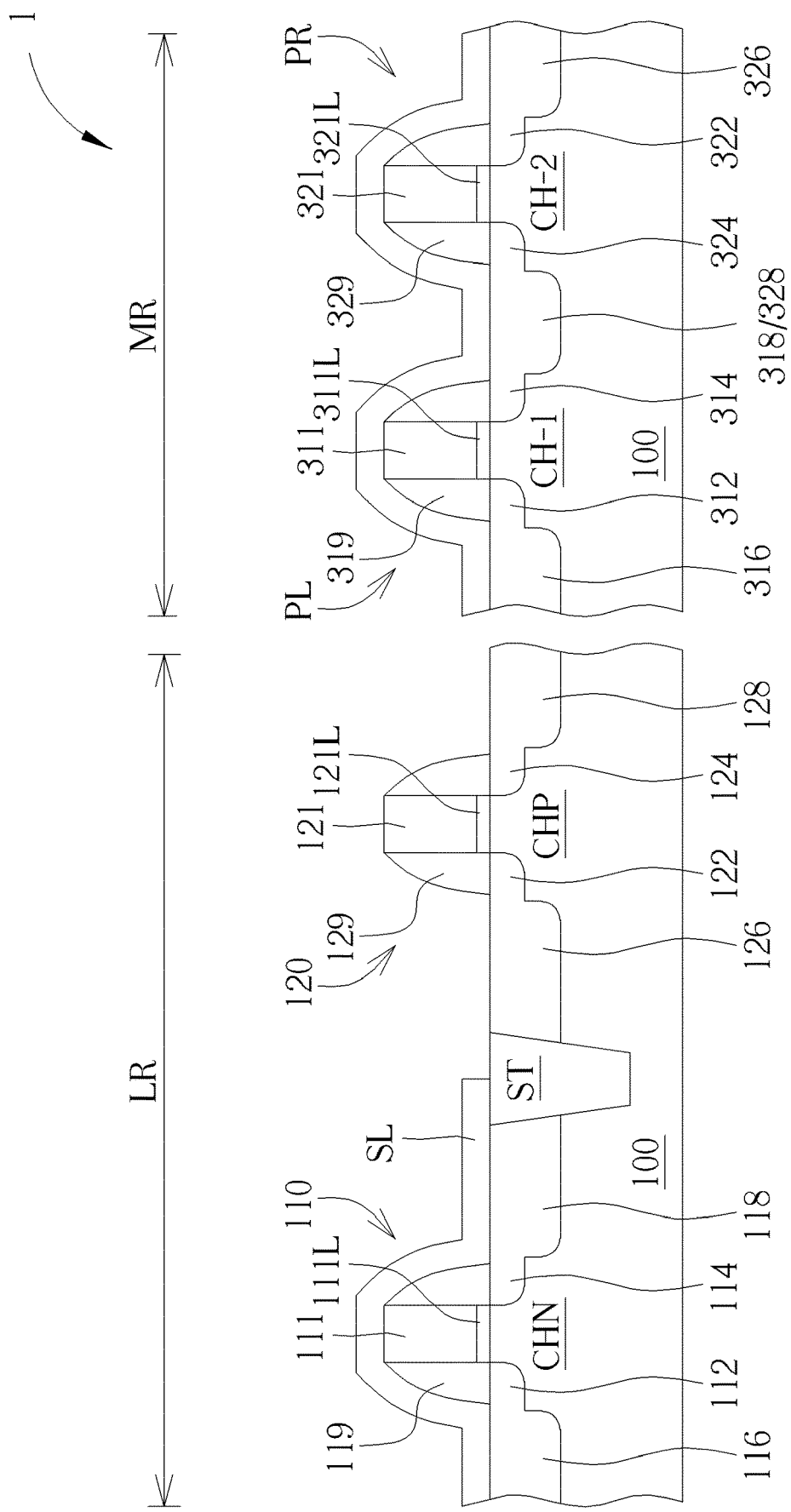
Figure 3:
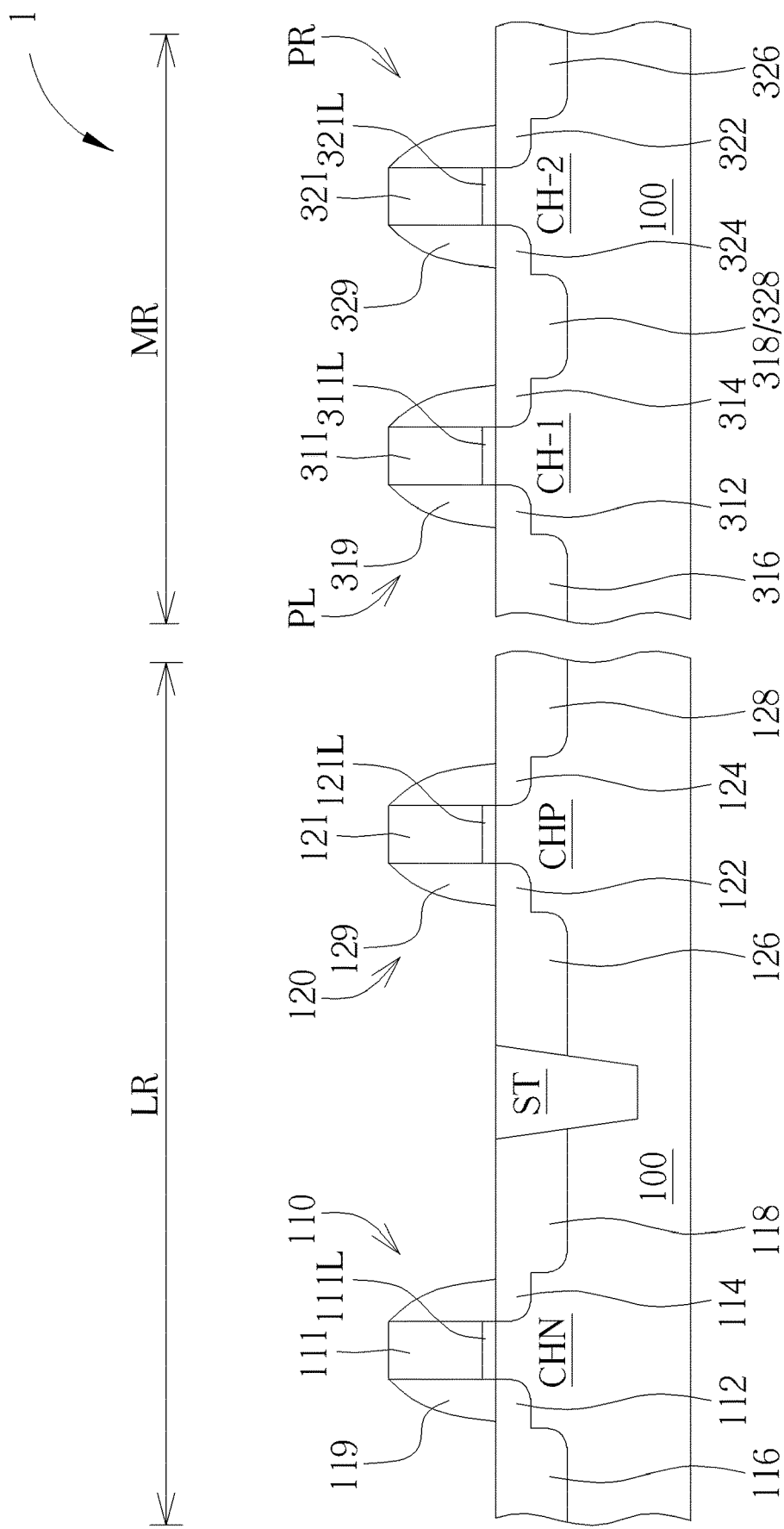

Please refer to FIG. 1 to FIG. 3, which illustrate a method of forming a semiconductor device 1. As shown in FIG. 1, a substrate 100 is provided with a logic circuit region LR and a memory cell region MR. According to an embodiment of the present invention, a static random access memory (SRAM) composed of a plurality of transistors will be formed in the memory cell region MR, for example, a six-transistor (6T) SRAM cell, which is composed of two cross-coupled invertor and two access transistors for reading and writing data. The access structure of the 6TSRAM cell can include two PMOS pull up transistors PL and PR.

In the process of manufacturing ultra-low voltage (ULP) SRAM below 40 nm, the P-type lightly doped drain (PLDD) mask is omitted, and the PLDD doping of the PMOS pull-up transistor PL is formed together with embedded high-voltage devices. This makes the PMOS pull-up transistor PL of the SRAM cell too fast in the electrical performance, causing the SRAM to face a problem of higher standby leakage current (Isb). The present invention addresses this issue.

According to an embodiment of the present invention, in FIG. 1, two PMOS pull-up transistors PL and PR are connected in series with each other. The PMOS pull-up transistor PL includes a gate 311, for example, a polysilicon gate disposed on the substrate 100. A gate dielectric layer 311L may be provided between the gate 311 and the substrate 100. The PMOS pull-up transistor PL further includes a PLDD region 312 and a PLDD region 314. The PLDD region 312 is connected to a P-type heavily doped region 316, and the PLDD region 314 is connected to a P-type heavily doped region 318. A channel area CH-1 is disposed between the PLDD area 312 and the PLDD area 314. A spacer 319 may be provided on the sidewall of the gate 311.

According to an embodiment of the present invention, the PMOS pull-up transistor PR includes a gate 321, for example, a polysilicon gate disposed on the substrate 100. A gate dielectric layer 321L may be provided between the gate 321 and the substrate 100. The PMOS pull-up transistor PR further includes a PLDD region 322 and a PLDD region 324.

The PLDD region 322 is connected to a P-type heavily doped region 326, and the PLDD region 324 is connected to a P-type heavily doped region 328. The P-type heavily doped region 328 and the P-type heavily doped region 318 are connected together. A channel area CH-2 is disposed between the PLDD area 322 and the PLDD area 324. A spacer 329 may be provided on the sidewall of the gate electrode 321.

According to an embodiment of the present invention, an NMOS transistor 110 and a PMOS transistor 120 may be formed in the logic circuit region LR. According to an embodiment of the present invention, the NMOS transistor 110 includes a gate 111, for example, a polysilicon gate disposed on the substrate 100. A gate dielectric layer 111L may be provided between the gate 111 and the substrate 100. The NMOS transistor 110 further includes an NLDD region 112 and an NLDD region 114. The NLDD region 112 is connected to an N-type heavily doped region 116, and the NLDD region 114 is connected to an N-type heavily doped region 118. A channel area CHN is disposed between the NLDD area 112 and the NLDD area 114. A spacer 119 may be provided on the sidewall of the gate 111.

According to an embodiment of the present invention, the PMOS transistor 120 includes a gate 121, for example, a polysilicon gate disposed on the substrate 100. A gate dielectric layer 121L may be provided between the gate 121 and the substrate 100. The PMOS transistor 120 further includes a PLDD region 122 and a PLDD region 124. The PLDD region 122 is connected to a P-type heavily doped region 126, and the PLDD region 124 is connected to a P-type heavily doped region 128. A channel area CHP is disposed between the PLDD area 122 and the PLDD area 124. A spacer 129 may be provided on the sidewall of the gate 121. A trench isolation structure ST is provided in the substrate 100 to isolate the NMOS transistor 110 and the PMOS transistor 120 from each other.

According to an embodiment of the present invention, after the transistors in the logic circuit region LR and the memory cell region MR are fabricated, a stressor layer SL is deposited in a blanket manner to cover the NMOS transistors 110 and PMOS transistor 120 in the logic circuit region LR, and the PMOS pull-up transistors PL and PR in the memory cell region MR. According to an embodiment of the present invention, the stressor layer SL may be a silicon nitride layer. According to an embodiment of the present invention, the stressor layer SL has tensile stress.

As shown in FIG. 2, a lithography and etching process is then performed to remove the stressor layer SL covering the PMOS transistor 120 in the logic circuit region LR. At this point, the remaining stressor layer SL still covers the NMOS transistor 110 in the logic circuit region LR and the PMOS pull-up transistors PL and PR in the memory cell region MR.

As shown in FIG. 3, subsequently, the NMOS transistor 110 and the PMOS transistor 120 in the logic circuit region LR and the PMOS pull-up transistors PL and PR in the memory cell region MR are subjected to an annealing process. The gate 111 of the NMOS transistor 110 in the logic circuit region LR and the gates 311 and 321 of the PMOS pull-up transistors PL and PR in the memory cell region MR are recrystallized under the influence of the stressor layer SL.

According to an embodiment of the present invention, the stressor layer SL generates a compressive stress. During the annealing process, the compressive stress is memorized in the gate 111 and the gates 311 and 321 when the gate 111 and the gates 311 and 321 are recrystallized. According to an embodiment of the present invention, the compressive stress memorized within the gate 111 and the gates 311, 321 induces compressive strain within the channel region CHN of the NMOS transistor 110 and the channel regions CH-1 and CH-2 of the PMOS pull-up transistors PL and PR.

According to an embodiment of the present invention, the compressive strain improves the performance of the NMOS transistor 110, but reduces the performance of the PMOS pull-up transistors PL and PR. According to an embodiment of the present invention, after the annealing process is completed, the remaining stressor layer SL is then removed.

One technical feature of the present invention is that the use of the stressor layer SL with tensile stress deliberately reduces the performance of the PMOS pull-up transistors PL and PR in the memory cell region MR, and solves the problem that the PMOS pull-up transistor PL of the SRAM cell is too fast on performance. This makes the standby leakage current (Isb) of SRAM can be restored to the normal range.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
   providing a substrate having a logic circuit region and a memory cell region thereon;
   forming a first transistor having a first gate, a second transistor having a second gate in the logic circuit region and a third transistor having a third gate in the memory cell region, wherein the first transistor is an NMOS transistor and the second transistor and the third transistor are PMOS transistors;
   depositing a stressor layer covering the first transistor and the second transistor in the logic circuit region and the third transistor in the memory cell region;
   removing the stressor layer on the second transistor in the logic circuit region; and
   subjecting the first transistor and the third transistor to an annealing process to recrystallize the first gate and the third gate under the influence of the stressor layer so as to degrade performance of the third transistor.

2. The method according to claim 1, wherein the stressor layer is a silicon nitride layer.

3. The method according to claim 1, wherein the stressor layer has a tensile stress.

4. The method according to claim 3, wherein the stressor layer generates a compressive stress that is memorized within the first gate and the third gate when the first gate and the third gate are recrystallized during the annealing process.

5. The method according to claim 4, wherein the compressive stress memorized within the first gate and the third gate induces a compressive strain within a first channel region of the first transistor and a third channel region of the third transistor.

6. The method according to claim 5, wherein the compressive strain enhances performance of the first transistor, while degrades performance of the third transistor.

7. The method according to claim 1, wherein the first gate and the third gate are polysilicon gates.

8. The method according to claim 1, wherein after subjecting the first transistor and the third transistor to the annealing process, the method further comprises:
   removing the stressor layer.

* * * * *